United States Patent
Hong

[11] Patent Number: 5,940,703
[45] Date of Patent: Aug. 17, 1999

[54] METHOD FOR MANUFACTURING DRAM CAPACITORS WITH T-SHAPE LOWER ELECTRODES BY ETCHING OXIDE SIDEWALLS

[75] Inventor: Gary Hong, Hsinchu, Taiwan

[73] Assignee: United Microelectronics Corp., Taiwan

[21] Appl. No.: 09/010,119

[22] Filed: Jan. 21, 1998

[30] Foreign Application Priority Data

Nov. 14, 1997 [TW] Taiwan ................................. 86116974

[51] Int. Cl.[6] ........................ H01L 21/8242; H01L 21/20
[52] U.S. Cl. .......................... 438/254; 438/256; 438/253; 438/396; 438/397; 438/399
[58] Field of Search .................................. 438/253, 254, 438/256, 396, 397, 399, 255, 398

[56] References Cited

U.S. PATENT DOCUMENTS

| | | | |
|---|---|---|---|
| 5,403,766 | 4/1995 | Miyake | 437/52 |
| 5,403,767 | 4/1995 | Kim | 437/52 |
| 5,482,885 | 1/1996 | Lur et al. | 437/60 |
| 5,656,532 | 8/1997 | Tseng | 438/253 |
| 5,661,064 | 8/1997 | Figura et al. | 438/396 |
| 5,728,617 | 3/1998 | Tseng | 438/253 |
| 5,854,107 | 12/1998 | Park et al. | 438/254 |
| 5,854,127 | 12/1998 | Pan | 438/629 |

*Primary Examiner*—Olik Chaudhuri
*Assistant Examiner*—Daniel H. Mao
*Attorney, Agent, or Firm*—Rabin & Champagne, P.C.

[57] ABSTRACT

A method for forming DRAM capacitor that utilizes the formation of an oxide layer and the subsequent etch-removal of a portion of the oxide layer located in the gap between a first masking layer and a second masking layer in order to form the minimum separation required between the lower electrodes of adjacent capacitors. Furthermore, when the etching operation is carried on into the conductive layer that lies below the oxide layer, the lower electrode of the capacitor is also patterned out. The manufacturing process in this invention does not use the conventional photolithographic technique, and therefore will not be limited by the resolution of the light source. Consequently, distance between two neighboring capacitors can be reduced, and a higher capacitance for the capacitors can be obtained.

22 Claims, 8 Drawing Sheets

METHOD FOR MANUFACTURING DRAM CAPACITORS WITH T-SHAPE LOWER ELECTRODES BY ETCHING OXIDE SIDEWALLS

CROSS-REFERENCE TO RELATED APPLICATION

This application claims the priority benefit of Taiwan application serial no. 86116974, filed Nov. 14, 1997, the full disclosure of which is incorporated herein by reference.

BACKGROUND OF THE INVENTION

1. Field of Invention

The present invention relates to a method for manufacturing DRAM capacitors. More particularly, the present invention relates to the method of manufacturing high-density DRAM capacitors.

2. Description of Related Art

Dynamic random access memories (DRAMs) are now extensively used in integrated circuit devices. As electronic industries continue to flourish, higher capacity DRAMs are in great demand. Therefore, high-density capacitors are constantly researched and developed.

DRAMs use an array of capacitors fabricated on a semiconductor substrate to store digital data. In general, the charge storage states are utilized to store a bit of data. Normally, a capacitor capable of discharging is regarded as in a logic "1" state, and a capacitor that need charging is regarded as in a logic "0" state. Hence, a single bit of binary data is stored in a capacitor.

The charge storage capacity of a capacitor depends on several factors including surface area within the electrode of a capacitor, the reliability of the electrode isolation and the dielectric constant of the dielectric layer between the electrodes of a capacitor. Storage and retrieval of data to and from memory as well as reading and writing operations are executed by the transfer of charges to or from the capacitor and passed through a transfer field effect transistor (FET) via a coupled bit line. The bit line is connected to one source/drain terminal of the transfer FET, while the charge storage capacitor is connected to the other source/drain terminal of the transfer FET.

The gate of the transfer FET is connected to a word line. Control signals can then be sent through the word line to the gate of the transfer FET, thereby switching the transistor on. Hence, electrical connection between one electrode of the capacitor and the bit line is established, and the transfer of charges to and from the capacitor is allowed.

As the density of memory cells in an integrated circuit is increased, the relative cost for producing each bit of storage will decrease. In general, the density of an integrated circuit device can be increased by: (1) reducing the structural dimensions such as shortening wiring lines and decreasing the width of transistor gate; (2) reducing the distance between adjacent integrated circuit devices. Generally, a reduction in the structural dimensions means reducing the device dimensions in an integrated circuit. However, to reduce the device dimensions while maintaining certain basic functions, layouts, designs and any modifications must be adhered to a set of design rules.

A number of problems will be produced when the design rules for building smaller DRAM devices are followed. For example, as the charge storage capacity of a DRAM capacitor becomes too small, a minimum number of charges cannot be maintained within the capacitor. Under such circumstances, reading from the DRAM cell will be prone to errors.

Moreover, the data stored in the DRAM cell will be very weak in resisting external noises or a leakage in current. Consequently, the data residing in the DRAM cell needs to be refreshed frequently. Hence, DRAM capacitors that has a larger charge storage capacity within the confining, surface area of a given wafer is in great demand in the semiconductor industry.

In the conventional method of manufacturing DRAM capacitor, conventional photolithographic and etching techniques are generally used in defining, the lower electrode of a capacitor. Most often in photolithographic process, resolution is limited by the light source. Therefore, the lower electrodes of adjacent capacitors cannot be brought too near. Consequently, usable surface area for the capacitor cannot be increased, and so the capacitance of a capacitor cannot be increased.

In light of the foregoing, there is a need to improve the method of manufacturing a collection of DRAM capacitors.

SUMMARY OF THE INVENTION

Accordingly, the present invention is to provide a method for manufacturing DRAM capacitor. The method does not use a conventional photolithographic process, and so minimum distance between two lower electrodes of neighboring capacitors is not limited by the resolution of light source. Hence, more area is spared. The spared area can then be used to increase the surface area of the electrode within a capacitor. Therefore, the capacitance of a capacitor can be increased.

To achieve these and other advantages and in accordance with the purpose of the invention, as embodied and broadly described herein, the invention provides a method for manufacturing DRAM capacitor. First, a semiconductor substrate having at least one MOS transistor formed thereon is provided. The MOS transistor has a gate, which is connected to a word line. Source/drain regions are formed in the substrate on each side of the gate.

A patterned polysilicon layer is also formed above and between two adjacent transistor gates. The patterned polysilicon layer, which serves as a bit line, is electrically coupled to one of the source/drain regions. The method of forming the DRAM capacitor comprises the steps of sequentially forming an insulating layer, a silicon nitride layer and a first oxide layer over the substrate, wherein the insulating layer covers the transistor. Next, a contact window is formed going through the insulating layer, the silicon nitride layer and the first oxide layer and exposing the source/drain region.

Thereafter, a first conductive layer is deposited into the contact window, and then a second conductive layer is formed over the first conductive layer and the first oxide layer. Next, a patterned first masking layer is formed over the second conductive layer exposing a portion of the second conductive layer, wherein the patterned first masking layer has a plurality of openings located above the contact windows. Then, a second oxide layer is formed over the first masking layer and the second conductive layer. Subsequently, a second masking layer is deposited into the openings. Using the first and the second masking layers as an etching mask, the second oxide layer above and to the side of the first masking layer is removed to expose a portion of the second conductive layer.

Next, the exposed second conductive layer is then removed until the first oxide layer is reached. In the subsequent step, the first and the second masking layers are removed to expose a portion of the second conductive layer and the second oxide layer. Next, the second oxide layer and the first oxide layer are removed to expose the silicon nitride layer, a large portion of the second conductive layer and a portion of the first conductive layer so that the second conductive layer only connects with the first conductive layer. Consequently, a T-shaped lower electrode comprising the second conductive layer and the first conductive layer is formed.

Finally, a dielectric layer is formed over the exposed surfaces of the T-shaped lower electrode, and then a third conductive layer is formed over the dielectric layer to constitute an upper electrode of the DRAM capacitor.

It is to be understood that both the foregoing, general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1I are cross-sectional views showing the progression of manufacturing steps in producing a DRAM capacitor according to one preferred embodiment of this invention.

Figure 1A:
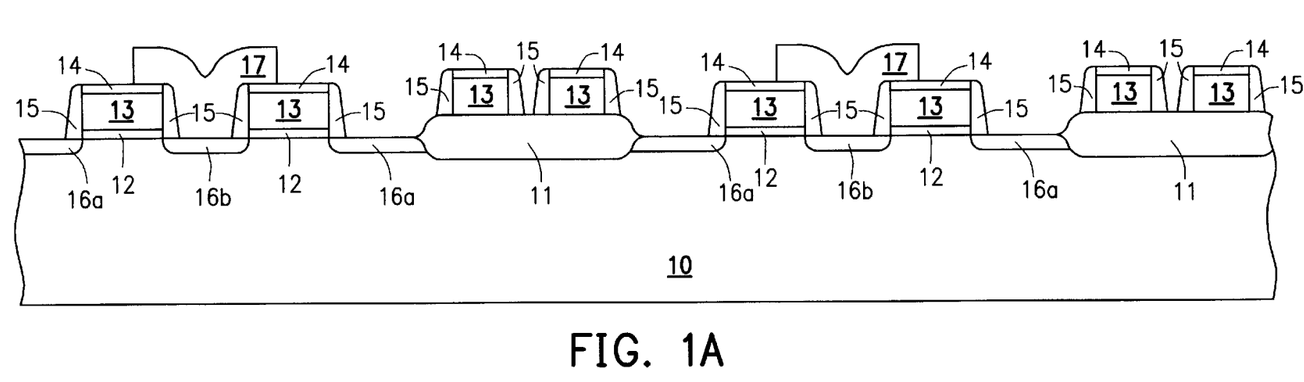
FIGS. 1A through 1I are cross-sectional views showing the progression of manufacturing steps in producing a DRAM capacitor according to one preferred embodiment of this invention.

First, as shown in FIG. 1A, a device isolation structure 11 is formed over a P-type silicon substrate 10. For example, in a LOCOS method, thermal oxidation is performed to build a field oxide layer having a thickness of about 3000 Å, or in a shallow trench isolation method, a shallow trench is made followed by depositing oxide into the trench. Next, a gate oxide layer 12 is formed over the silicon substrate 10 using a thermal oxidation method.

Then, a polysilicon layer is formed over the gate oxide layer using, for example, a low pressure chemical vapor deposition (LPCVD) method. The polysilicon layer is impurities-doped to increase its electrical conductivity. Finally, the polysilicon layer is patterned to form a gate terminal 13 (also known as the word line). Subsequently, an oxide layer 14 is formed over the polysilicon gate 13 for protecting the polysilicon gate 13 or serving as an etching barrier layer in subsequent processes.

Next, oxide spacers 15 are formed on the sidewalls of the polysilicon gate 13. Then, a self-aligned ion implantation using the oxide spacers 15 as channeling guides are performed to implant ions, for example, arsenic ions, into the substrate 10 to form N-type source/drain regions 16a and 16b. Thereafter, using a LPCVD method, a self-aligned contact that serves as a bit line 17 is formed on the surface of the device by forming a polysilicon layer over the device followed by patterning. The bit line 17 is electrically coupled to the source/drain region 16b, thus completing the basic steps in the fabrication of a transistor structure.

Figure 1B:
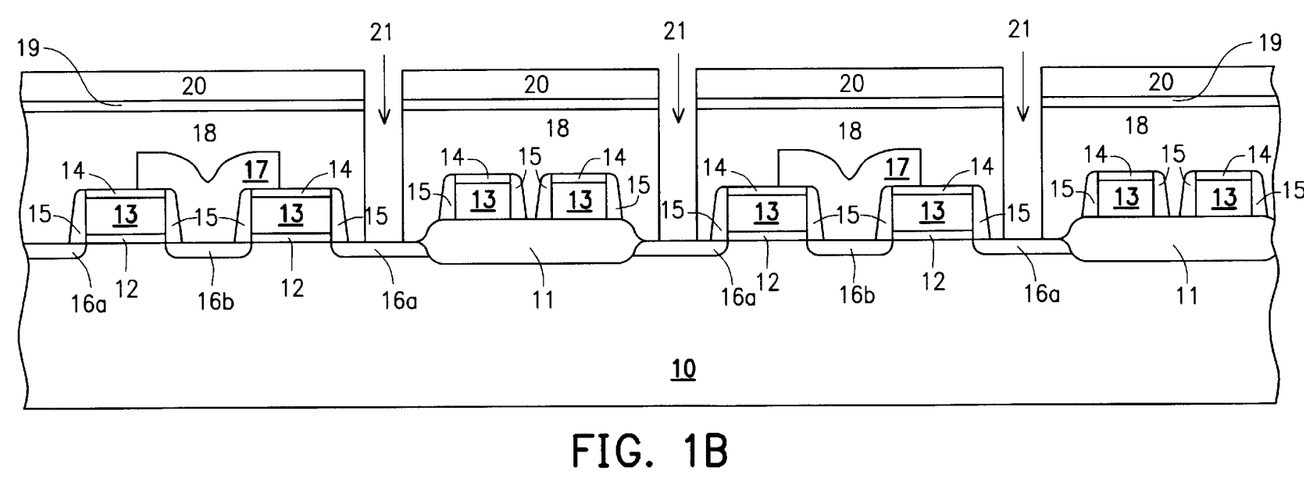

Next, as shown in FIG. 1B, a planarized insulating layer 18 is deposited over the word lines 13 and the bit lines 17 by a CVD method. For example, an atmospheric pressure chemical vapor deposition (APCVD) method or a plasma-enhanced chemical vapor deposition (PECVD) method is used to deposit a borophosphosilicate glass (BPSG) layer. Then, the BPSG layer undergoes a heat reflow operation or a chemical-mechanical polishing (CMP) operation. Planarization makes subsequent deposition easier and having a better quality. Next, a silicon nitride ($Si_3N_4$) layer 19 and a first oxide layer 20 are deposited over the insulating, layer 18.

Thereafter, a conventional photolithographic process is used to form a pattern on the first oxide layer 20. Then, a conventional etching process is used to remove a portion of the first oxide layer, the silicon nitride layer 19 and the insulating layer 18 to form contact windows 21 exposing the source/drain regions 16a. The silicon nitride layer preferably has a thickness of about 100 Å to 1000 Å, and the first oxide layer preferably has a thickness of about 200 Å to 2000 Å.

Figure 1C:
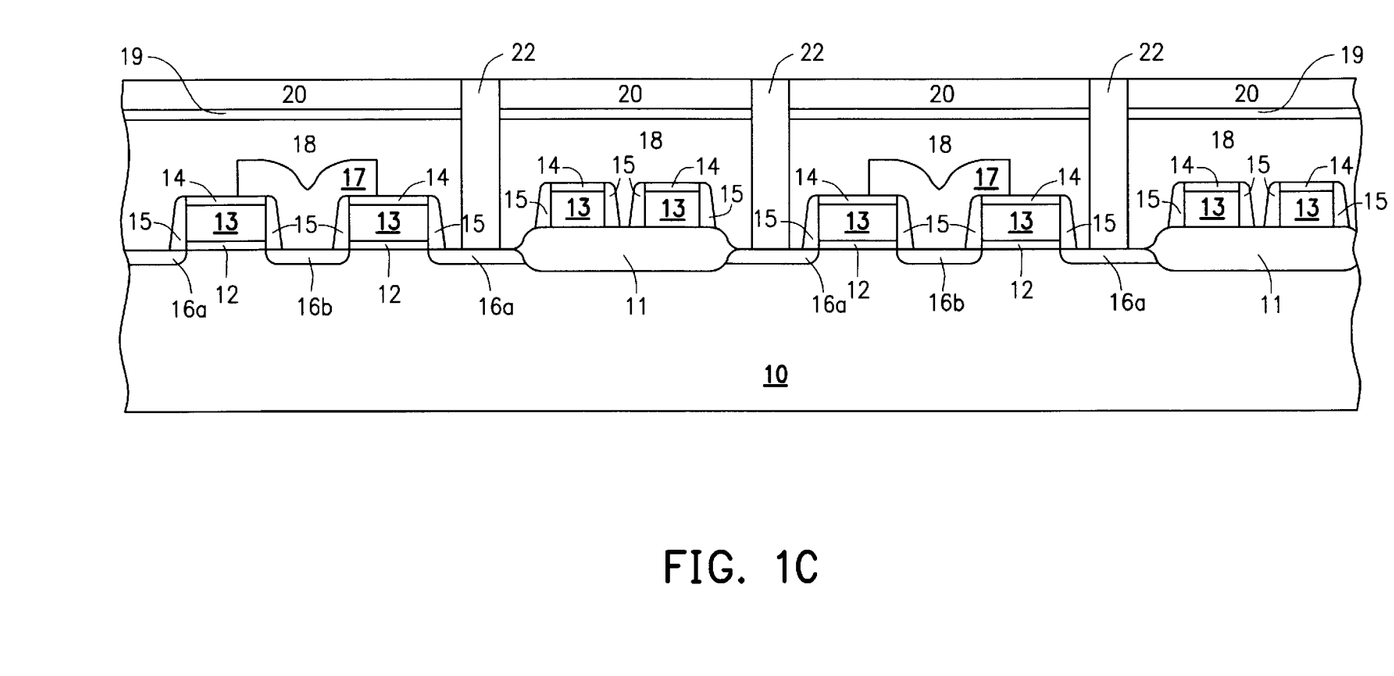

Next, as shown in FIG. 1C, a first conductive layer, for example, a tungsten layer, is formed filling, the contact window 21 and extends to cover the first oxide layer 20. Thereafter, using the first oxide layer 20 as an etching stop, the first conductive layer is etched back using, for example, a dry etching method or a CMP operation. Hence, the first oxide layer is exposed and a plug 22, which is electrically coupled to a source/drain region 16, is formed.

Figure 1D:
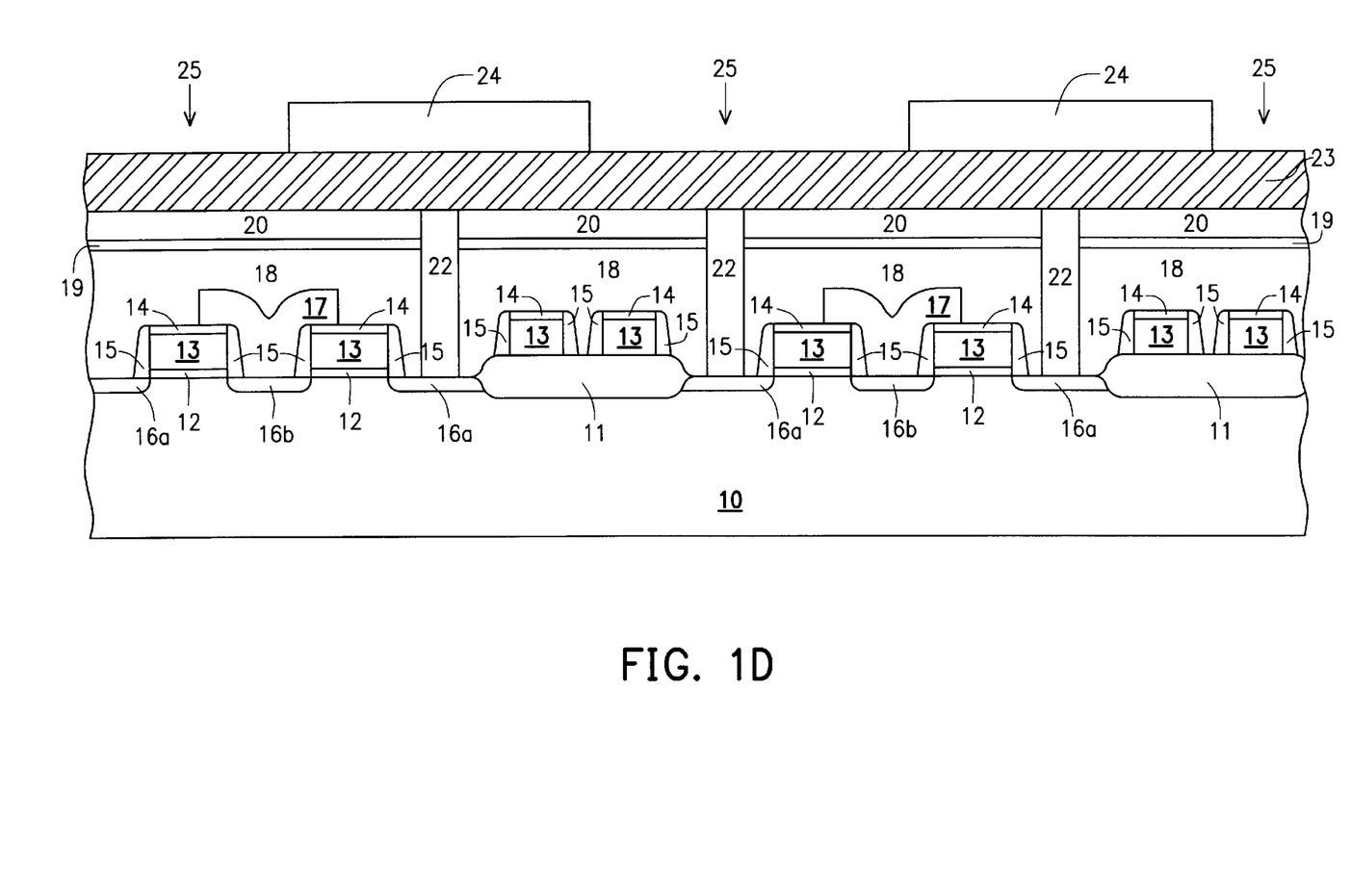

Next, as shown in FIG. 1D, a second conductive layer 23 is formed over the first oxide layer 20 and the plugs 22. The second conductive layer 23 can be a polysilicon layer impurities-doped to increase its electrical conductivity. Alternatively, an impurities-doped polysilicon layer can be directly deposited into the contact windows 21 and extended to cover the first oxide layer acting as a lower electrode conductive layer.

Next, a first masking layer is formed over the second conductive layer. Through photolithographic and etching processes, the first masking layer is patterned to form a first masking layer 24, wherein a portion of the patterned first masking layer 24 is located above the plug 22. Furthermore, a plurality of openings 25 is formed in the first masking layer 24 exposing a portion of the second conductive layer 23.

Figure 1E:
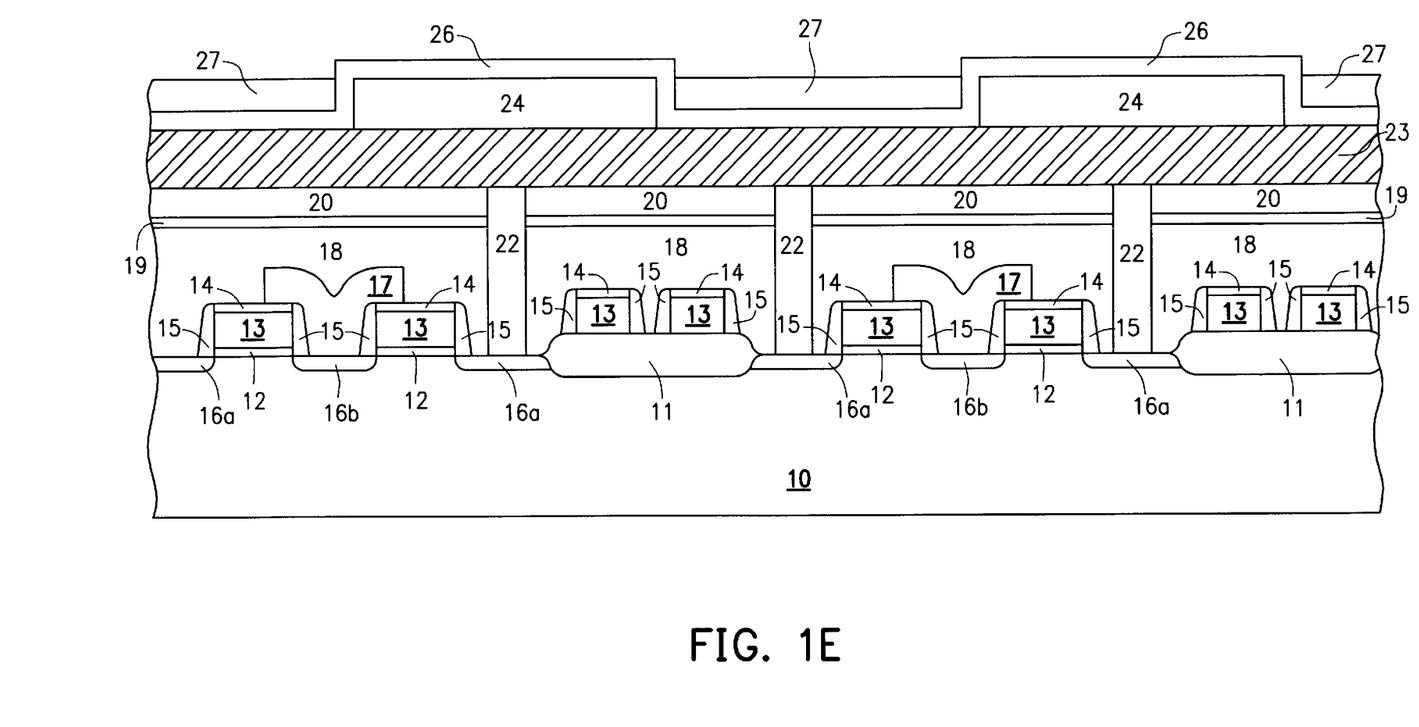

Next, as shown in FIG. 1E, a second oxide layer 26 preferably having a thickness of about 100 Å to 2000 Å is formed over the first masking layer 24 and the exposed second conductive layer 23. The second oxide layer 26 can be formed using, for example, a low pressure chemical vapor deposition (LPCVD) method. Thereafter, a second masking layer 27 is formed over the second oxide layer 26 and deposited to fill the openings between the first masking layers 24 using, for example, a spin-coating method. Then, using the second oxide layer 26 as an etching stop layer, the second masking layer 27 is etched back to fill the openings between the first masking layers 24.

Figure 1F:
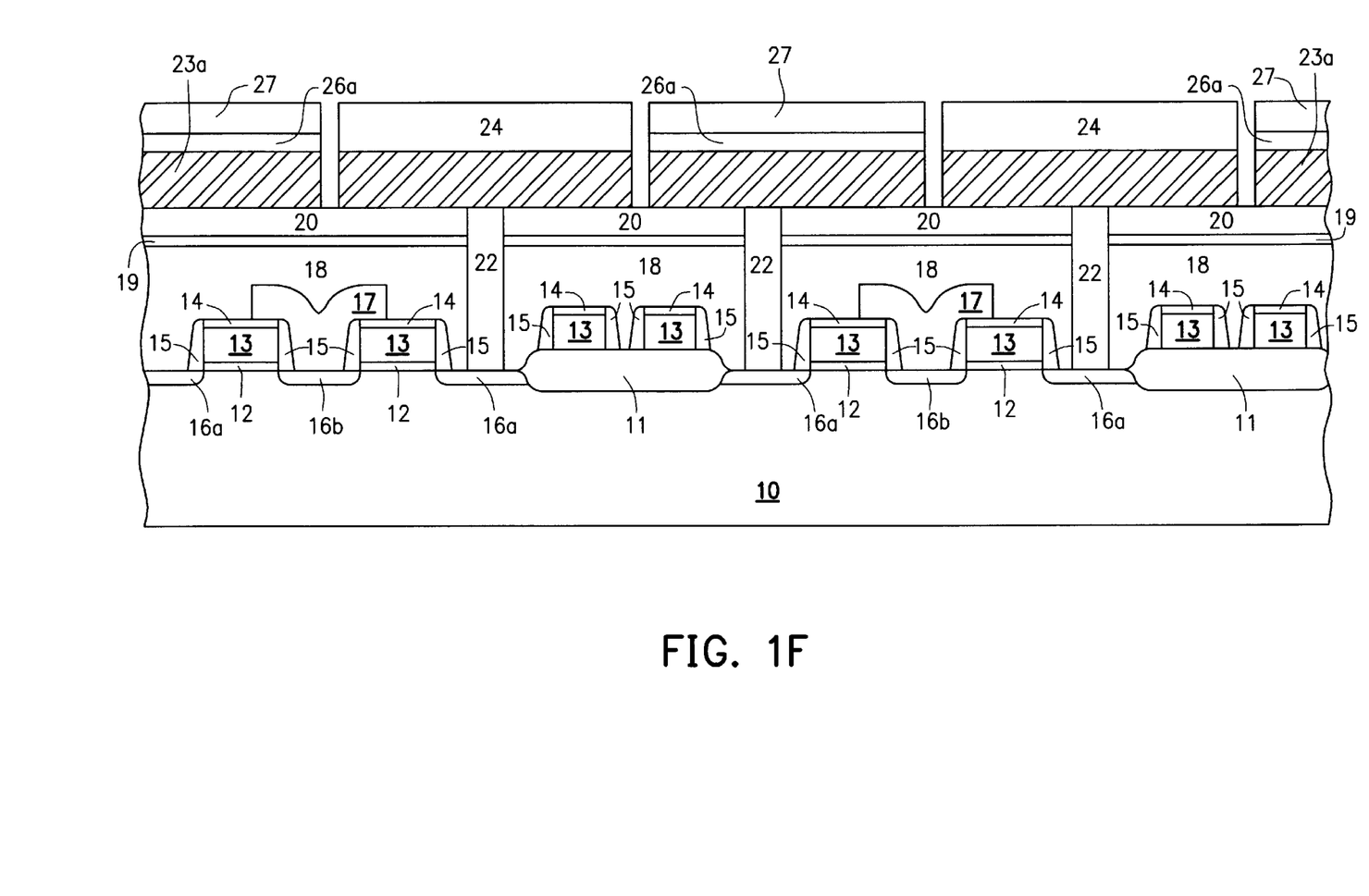

Next, as shown in FIG. 1F, using the first masking layer 24 and the second masking layer 27 as an etching mask, the second oxide layer 26 above the first masking layer 24 and the second oxide layer 26 on the sides of the first masking layer 24 is removed. In other words, the second oxide layer 26 located between the first masking layer 24 and the second masking layer 27 is removed to expose a portion of the second conductive layer 23. Next, the exposed second conductive layer 23 is etched using, for example, an anisotropic dry etching operation, until a portion of the first oxide layer 20 is exposed.

Due to the removal of the second oxide layer 26 between the first masking layer 24 and the second masking layer 27 and portions of the second conductive layer until the first oxide layer 20 is reached, a gap is formed that can be utilized to separate the lower electrodes of adjacent capacitors. Since the width of the gap depends on the thickness of the second oxide layer originally deposited and not on the resolution of light source in a conventional photolithographic process, a higher density for laying capacitors can be achieved.

Figure 1G:
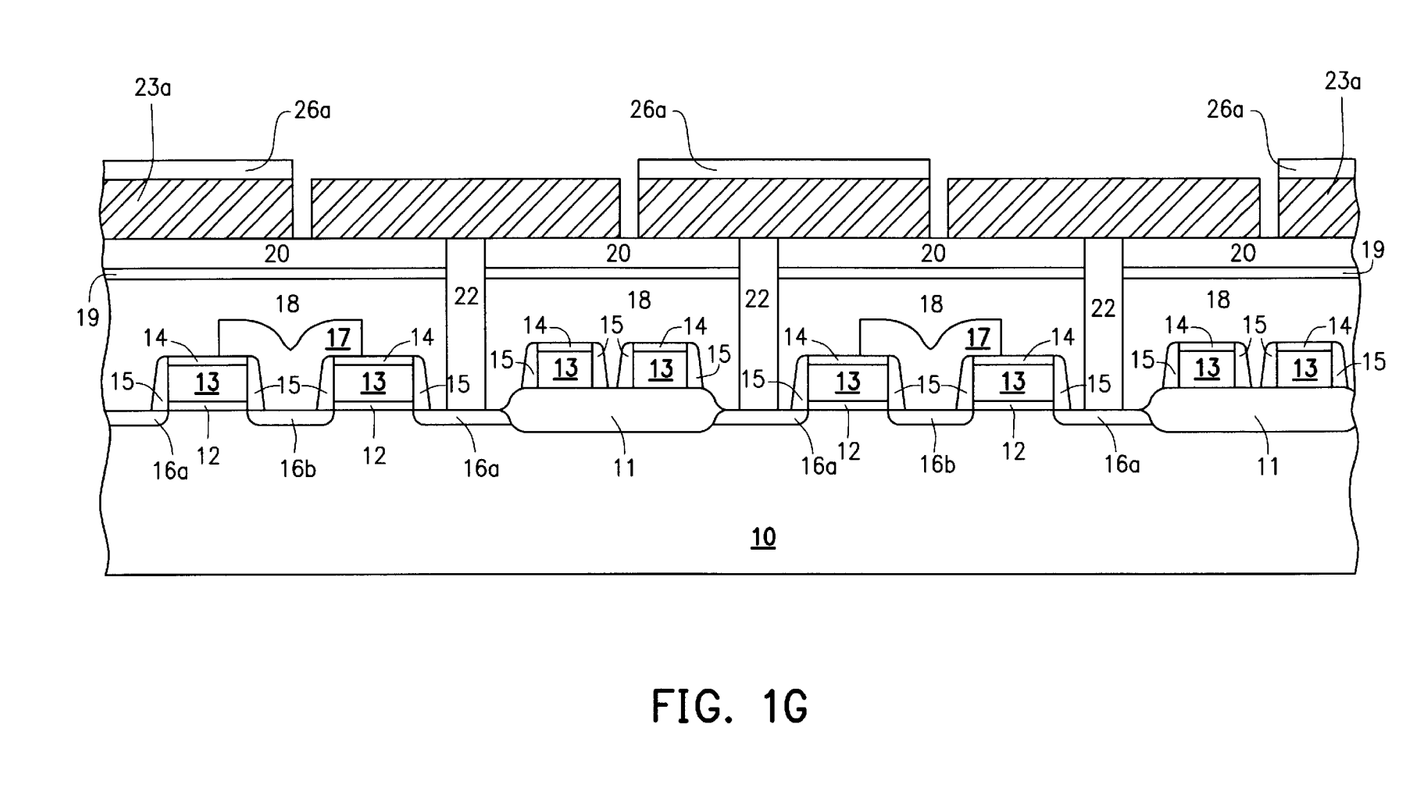

Next, as shown in FIG. 1G, the first masking layer 24 and the second masking layer 27 are removed to expose the second conductive layer 23a and the second oxide layer 26a.

Figure 1H:
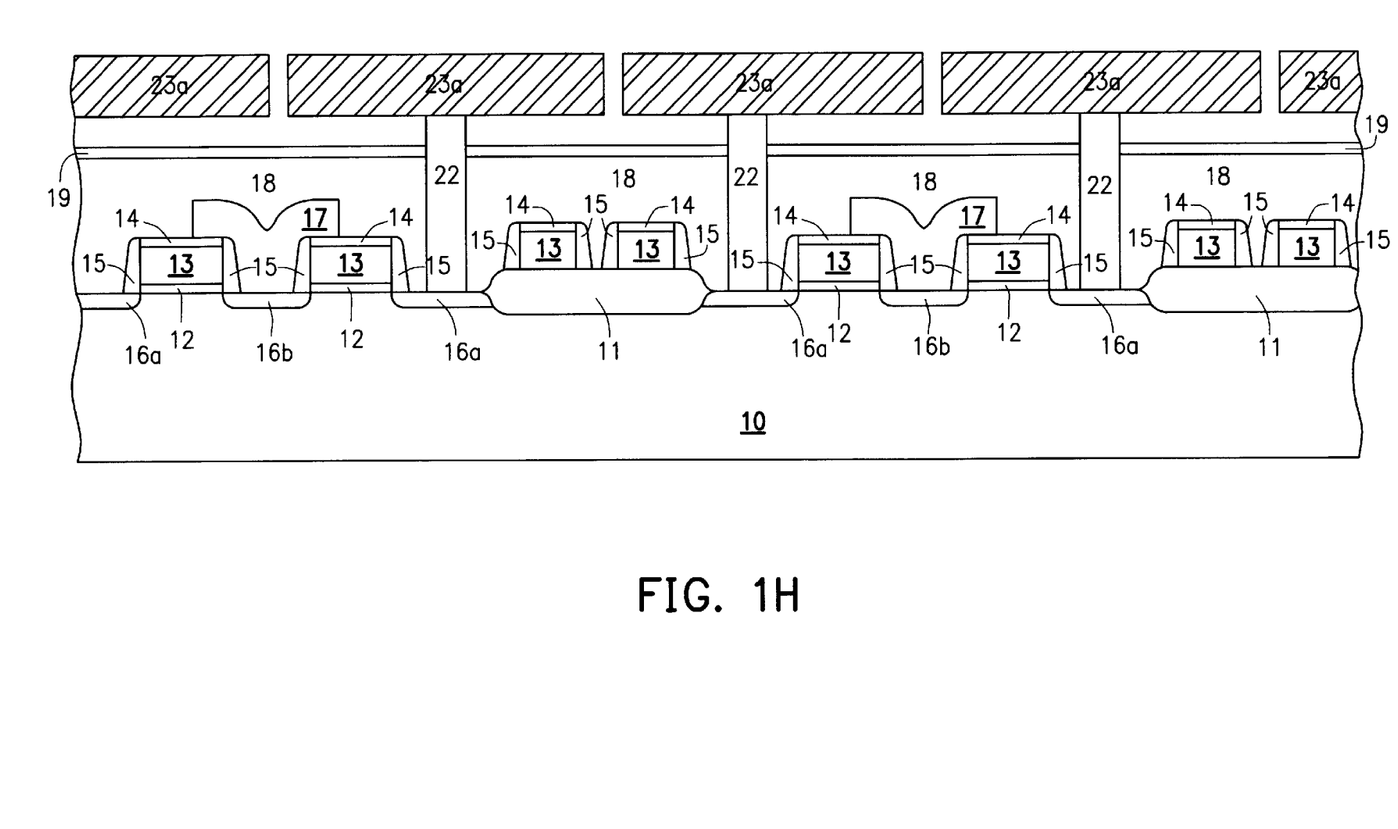

Next, as shown in FIG. 1H, the second oxide layer 26a and the first oxide layer 20 are removed using, for example, hydrofluoric acid solution as an etchant in a wet etching operation. After the etching operation, the silicon nitride layer 19, a large portion of the second conductive layer 23a and a portion of the first conductive layer or plug 22 are exposed. The lower surface of the second conductive layer 23a is joined together with the top surface of the first conductive layer or plug 22 to form a T-shaped lower electrode for the capacitor.

Figure 1I:
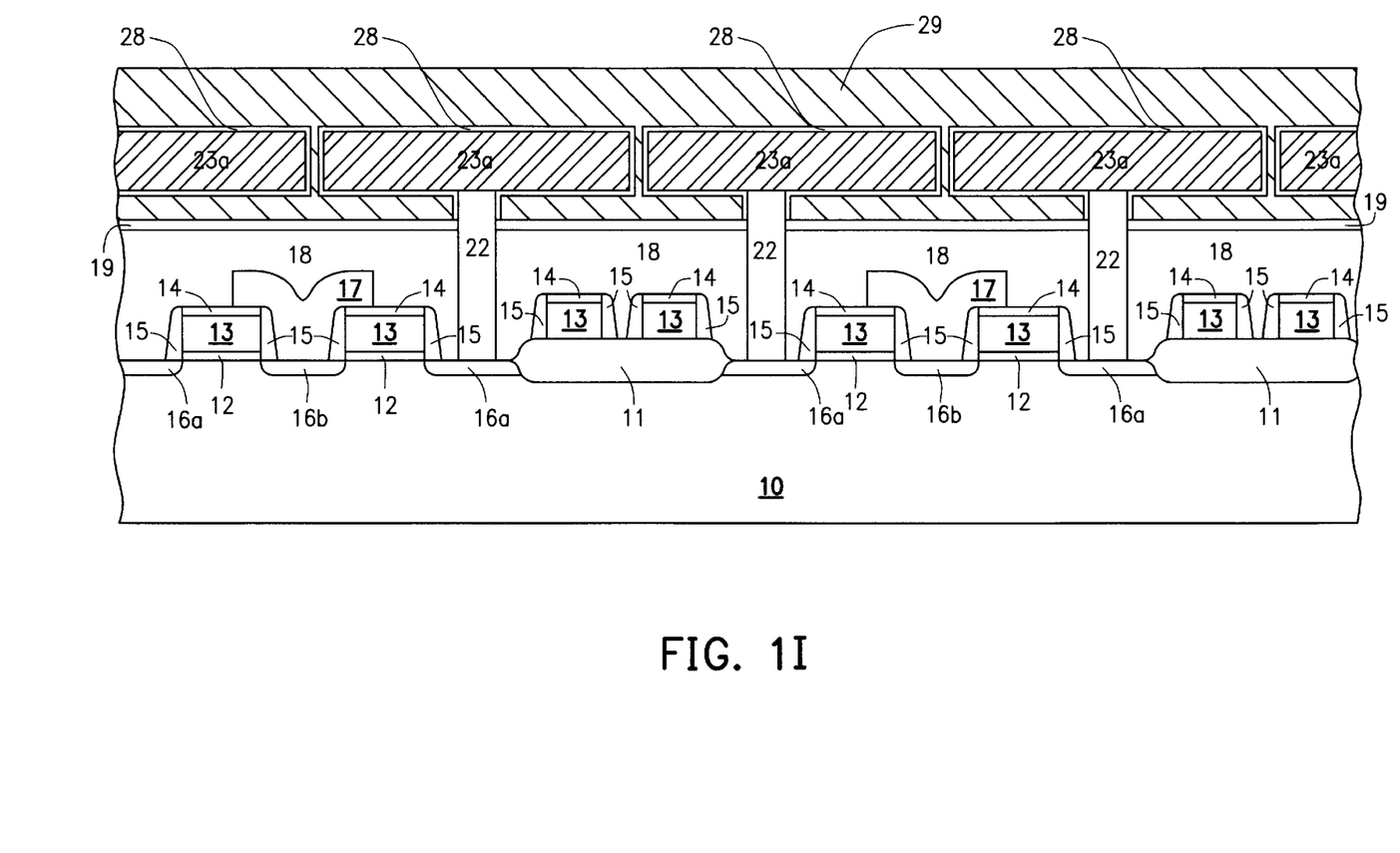

Finally, as shown in FIG. 1I, a dielectric layer 28 is formed over the surfaces of the T-shaped lower electrode, The dielectric layer 28 can be, for example, a nitride/oxide (NO) composite layer or one having a high dielectric constant such as a tantalum pentoxide ($Ta_2O_5$) layer. Thereafter, a third conductive layer 29, for example, an impurities-doped polysilicon layer, is formed over the dielectric layer 28 acting as an upper electrode. The third conductive layer 29 also completely fills the leftover space after the removal of the first oxide layer.

The main goal of this embodiment is to create a small separation between the lower electrodes of adjacent capacitors. This is achieved through etching away the second oxide layer between the first masking layer and the second masking layer followed by etching the second conductive layer. This manufacturing process does not use the conventional photolithographic technique, and therefore will not be limited by the resolution of the light source. Consequently, distance between two neighboring capacitors can be reduced, and a higher capacitance for the capacitors can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor on a semiconductor substrate, wherein one or more MOS transistors is formed on the substrate, with a gate terminal connected to a word line and source/drain regions formed in the substrate on two sides of the transistor, and that a polysilicon layer is patterned above and between transistors serving as a bit line and is electrically coupled to one source/drain region of a MOS transistor, comprising the steps of:

forming an insulating layer, a silicon nitride layer and a first oxide layer over the substrate, wherein the insulating layer cover the transistors;

forming a contact window in the insulating layer, the silicon nitride layer and the first oxide layer to expose the source/drain region;

depositing a first conductive layer into the contact window;

forming a second conductive layer over the first conductive layer and the first oxide layer;

forming a patterned first masking layer over the second conductive layer, wherein the patterned first masking layer has a plurality of openings with a portion of each opening located above the contact window and that the openings expose a portion of the second conductive layer;

forming a second oxide layer over the first masking layer and the second conductive layer;

depositing a second masking layer into the openings;

removing the second oxide layer above and on the sides of the first masking layer using the first masking layer and the second masking layer as an etching mask to expose a portion of the second conductive layer, then removing the exposed portion of the second conductive layer until the first oxide layer is exposed;

removing the first masking layer and the second masking layer to expose portions of the second conductive layer and the second oxide layer;

removing the second oxide layer and the first oxide layer such that the second conductive layer is connected to the first conductive layer only and that the silicon nitride layer, a large portion of the second conductive layer and a portion of the first conductive layer are exposed, and that a T-shaped lower electrode is formed from a combination of the first conductive layer and the second conductive layer;

forming a dielectric layer over the exposed T-shaped lower electrode surfaces; and forming a third conductive layer that acts as an upper electrode for the DRAM capacitor over the dielectric layer.

2. The method of claim 1, wherein the step of depositing the first conductive layer into the contact window includes the substeps of:

forming the first conductive layer over the first oxide layer and filling the contact window; and etching back the first conductive to expose the first oxide layer using the first oxide layer as an etching stop layer.

3. The method of claim 2, wherein the step of forming the first conductive layer includes depositing tungsten.

4. The method of claim 1, wherein the second oxide layer has a thickness of about 100 Å to 2000 Å.

5. The method of claim 1, wherein the thickness of the second oxide layer is the minimum distance of separation between the lower electrodes of adjacent capacitors.

6. The method of claim 1, wherein the step of depositing the second masking layer into the openings includes the substeps of:

forming the second masking layer over the second oxide layer that also fills the openings; and etching back the second masking layer to expose the second oxide layer above the first masking layer using the second oxide layer as an etching stop layer.

7. The method of claim 1, wherein the step of removing the fist oxide layer and the second oxide layer includes using hydrofluoric acid solution in a wet etching operation.

8. The method of claim 1, wherein the step of forming the dielectric layer includes depositing nitride and then oxide (NO) or tantalum pentoxide ($Ta_2O_5$).

9. The method of claim 1, wherein the step of forming the insulating layer includes depositing oxide.

10. The method of claim 1, wherein the step of forming the second conductive layer includes depositing impurities-doped polysilicon.

11. The method of claim 1, wherein the step of forming the third conductive layer includes depositing impurities-doped polysilicon.

12. The method of claim 1, wherein the step of forming the first masking layer includes depositing silicon nitride.

13. The method of claim 1, wherein the step of forming the second masking layer includes depositing photoresist.

14. The method of claim 13, wherein the step of depositing photoresist includes a spin-coating method.

15. The method of claim 1, wherein the silicon nitride layer has a thickness of about 100 Å to 2000 Å.

16. The method of claim 1, wherein the first oxide layer has a thickness of about 200 Å to 2000 Å.

17. A method for manufacturing a DRAM capacitor on a semiconductor substrate, wherein one or more MOS transistors is formed on the substrate, with a gate terminal connected to a word line and source/drain regions formed in the substrate on two sides of the transistor, and that a polysilicon layer is patterned above and between transistors serving as a bit line and is electrically coupled to one source/drain region of a MOS transistor, comprising the steps of:

forming an insulating layer, a silicon nitride layer and a first oxide layer over the substrate, wherein the insulating layer cover the transistors;

forming a contact window in the insulating layer, the silicon nitride layer and the first oxide layer to expose the source/drain region;

depositing a first conductive layer into the contact window and over the first oxide layer;

forming a patterned first masking layer over the first conductive layer, wherein the patterned first masking layer has a plurality of openings with a portion of each opening located above the contact window and that the openings expose a portion of the first conductive layer;

forming a second oxide layer over the first masking layer and the first conductive layer;

depositing a second masking layer into the openings;

removing the second oxide layer above and on the sides of the first masking layer using the first masking layer and the second masking layer as an etching mask to expose a portion of the first conductive layer, then removing the exposed portion of the first conductive layer until the first oxide layer is exposed;

removing the first masking layer and the second masking layer to expose portions of the first conductive layer and the second oxide layer;

removing the second oxide layer and the first oxide layer such that the silicon nitride layer and a portion of the first conductive layer are exposed, and that a T-shaped lower electrode made from the first conductive layer is formed;

forming a dielectric layer over the exposed T-shaped lower electrode surfaces; and forming a second conductive layer that acts as an upper electrode for the DRAM capacitor over the dielectric layer.

18. The method of claim 17, wherein the step of forming the first conductive layer includes depositing impurities-doped polysilicon.

19. The method of claim 17, wherein the step of forming the second conductive layer includes depositing impurities-doped polysilicon.

20. The method of claim 17, wherein the step of forming the first masking layer includes depositing silicon nitride.

21. The method of claim 17, wherein the step of forming the second masking layer includes depositing photoresist.

22. The method of claim 17, wherein the thickness of the second oxide layer is the minimum distance of separation between the lower electrodes of adjacent capacitors.

* * * * *